United States Patent [19]

Kuromaru

[11] Patent Number: 4,539,582
[45] Date of Patent: Sep. 3, 1985

[54] ANTI-SHORT BONDING PAD STRUCTURE

[75] Inventor: Akira Kuromaru, Kawasaki, Japan

[73] Assignee: Tokyo Shibaura Denki Kabushiki Kaisha, Japan

[21] Appl. No.: 649,955

[22] Filed: Sep. 11, 1984

Related U.S. Application Data

[63] Continuation of Ser. No. 267,924, May 28, 1981, abandoned.

[30] Foreign Application Priority Data

Jun. 10, 1980 [JP] Japan ................................ 55-78158

[51] Int. Cl.³ ..................... H01L 23/48; H01L 29/46; H01L 29/34; H01L 29/06
[52] U.S. Cl. ...................................... 357/71; 357/68; 357/54; 357/55
[58] Field of Search ................ 357/54, 55, 68, 71

[56] References Cited

U.S. PATENT DOCUMENTS

| | | | |
|---|---|---|---|
| 3,717,567 | 2/1973 | Bhatt | 357/71 X |
| 3,721,838 | 3/1973 | Brickman et al. | 357/45 X |
| 3,942,187 | 3/1976 | Gelsing et al. | 357/71 |
| 4,060,828 | 11/1977 | Satonaka | 357/71 |
| 4,198,648 | 4/1980 | Nishizawa | 357/55 X |
| 4,228,447 | 10/1980 | Sato et al. | 357/55 X |
| 4,259,678 | 3/1981 | van Gorkom et al. | 357/55 X |
| 4,270,262 | 6/1981 | Hori et al. | 357/54 X |

FOREIGN PATENT DOCUMENTS

| | | | |
|---|---|---|---|
| 1589779 | 5/1970 | Fed. Rep. of Germany | 357/68 |
| 2348323 | 4/1975 | Fed. Rep. of Germany | 357/65 |
| 2813968 | 10/1978 | Fed. Rep. of Germany | 357/71 |
| 2727319 | 1/1979 | Fed. Rep. of Germany | 357/71 |
| 50-28763 | 3/1975 | Japan | 357/68 |
| 54-139374 | 10/1979 | Japan | 357/68 |
| 1529518 | 10/1978 | United Kingdom | 29/576 |
| 2083283 | 3/1982 | United Kingdom | 357/72 |

Primary Examiner—Andrew J. James
Assistant Examiner—John LaMont
Attorney, Agent, or Firm—Finnegan, Henderson, Farabow, Garrett & Dunner

[57] ABSTRACT

A semiconductor device comprising a semiconductor substrate, a first insulating layer formed on the semiconductor substrate, a bonding pad formed on the first insulating layer, a conductive layer formed on the first insulating layer and adjacent to the bonding pad, and a second insulating layer formed to cover the conductive layer characterized in that the surface of the second insulating layer formed on and near the conductive layer is made at the same level as or lower than the surface of the bonding pad.

8 Claims, 27 Drawing Figures

ANTI-SHORT BONDING PAD STRUCTURE

This application is a continuation of Ser. No. 267,924, filed May 28, 1981, now abandoned.

The present invention relates to a semiconductor device having bonding pads.

Figure 1:
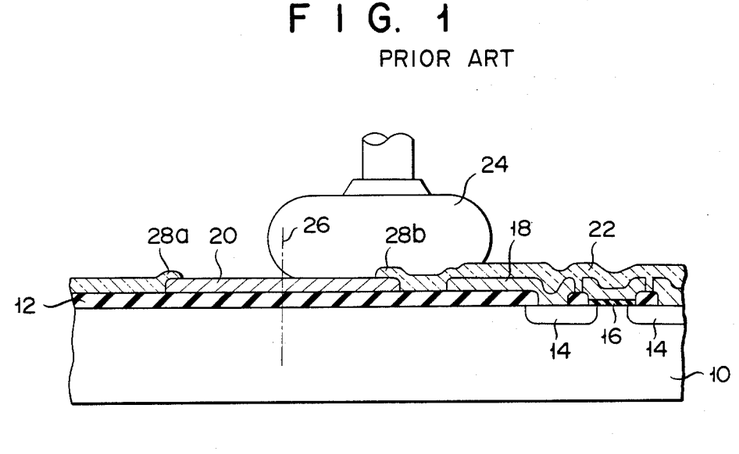
FIG. 1 is a cross sectional view showing the prior art semiconductor device.
Figure 2:
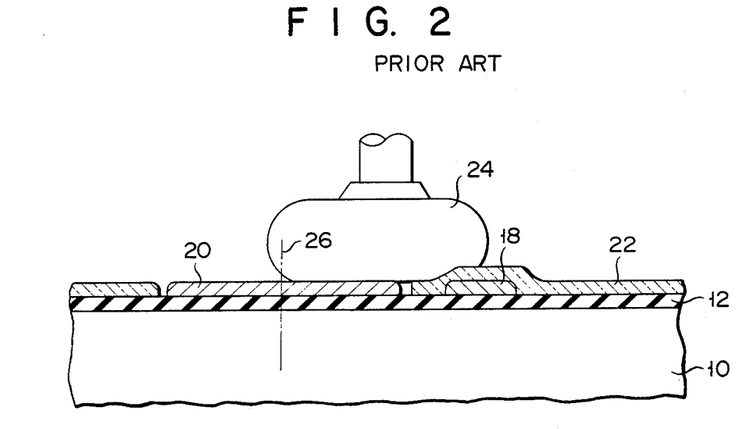
FIG. 2 is a cross sectional view showing another prior art semiconductor device.

The peripheral portion of a bonding pad in MOS integrated circuit, for example, is hitherto constructed as shown in FIGS. 1 and 2. The structure shown in FIG. 1 is formed by the following step. Oxide film (film of $SiO_2$ type) 12 is formed by heat oxidation or CVD (chemical vapor deposition) method on the surface of a semiconductor substrate 10 of N or P type. This oxide film 12 is subject to photo-etching to form holes for diffusing, through which impurity is selectively diffused to form a diffusion layer 14 of opposite conductive type to that of semiconductor substrate 10. Oxide film 12 adjacent to the diffusion layer 14 is removed and gate oxide film 16 is then formed in the removed portion. Aluminum is vapor-deposited all over the surface of a chip. The aluminum layer thus formed is then selectively removed to form electrode wiring 18 and bonding pad 20. A PSG layer (Phospho-Silicate Glass layer) 22 for surface protection is formed by CVD all over the surface of the chip, and the PSG layer 22 formed on the bonding pad 20 is removed to an extent smaller than the surface area of bonding pad 20. A gold ball 24 arranged at the foremost end of a bonding wire is pressedly attached to the surface of the bonding pad 20.

FIG. 2 shows the cross section of another chip in which the PSG layer 22 formed on the bonding pad 20 is removed to an extent larger than the surface area of the bonding pad 20.

In the case of semiconductor devices thus formed, the oxide film 12 is formed on the semiconductor substrate 10 with a uniform thickness, and the electrode wiring 18 consisting of aluminum and bonding pad 20 formed on the oxide film 12 are therefore formed in the same plane. In the case of semiconductor devices in which inner elements including the electrode wiring 18 are protected by the PSG layer 22 is, the PSG layer 22 positioned above the bonding pad 20 to an extent corresponding to the thickness of PSG layer 22. Semiconductor devices of these days have the tendency of shortening the distance between the bonding pad 20 and electrode wiring 18 so as to achieve high integration. When the center of the gold ball 24 is displaced from the center of bonding pad 20 in the bonding process in this case, the gold ball 24 is apt to locate above or come nearer the electrode wiring 18. If so, concentrated strain due to impact load appears in the PSG layer 22 and causes the PSG layer easily to crack at the time of bonding the gold ball to the bonding pad because the PSG layer 22 protecting the electrode wiring 18 is weak in mechanical strength. When gold comes into the cracked portion, an improper electrical connection results.

Figure 3:
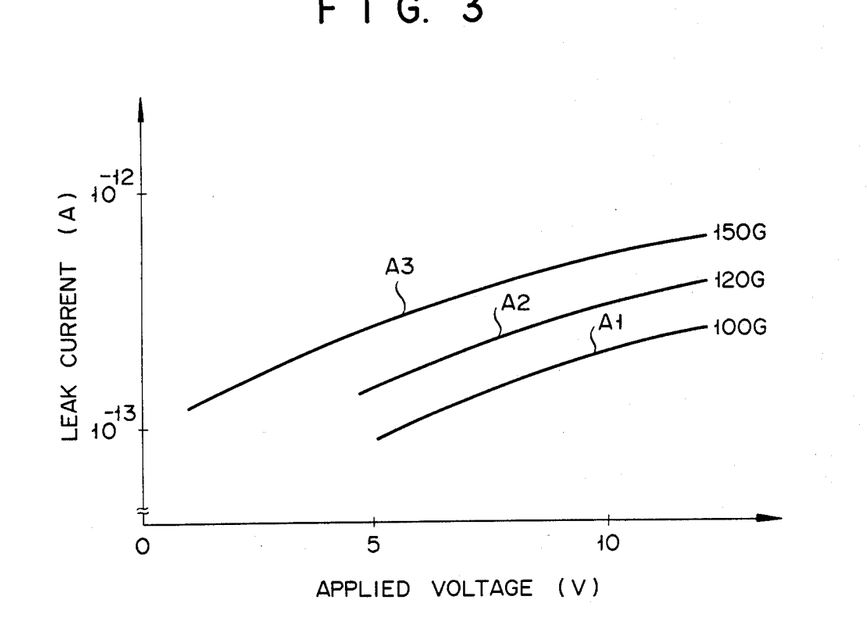
FIG. 3 is a graph showing the relation between leak current and voltage impressed to the PN junction.

FIG. 3 shows the relation between leak current and voltage applied to semiconductor elements adjacent to the bonding pad in which bonding load is used as a parameter. Curve A1 shows the relation when bonding load is 100 g, curve A2 the relation when bonding load is 120 g, and curve A3 the relation when bonding load is 150 g. It is apparent from FIG. 3 that leak current becomes large when bonding load is large.

Figure 4:
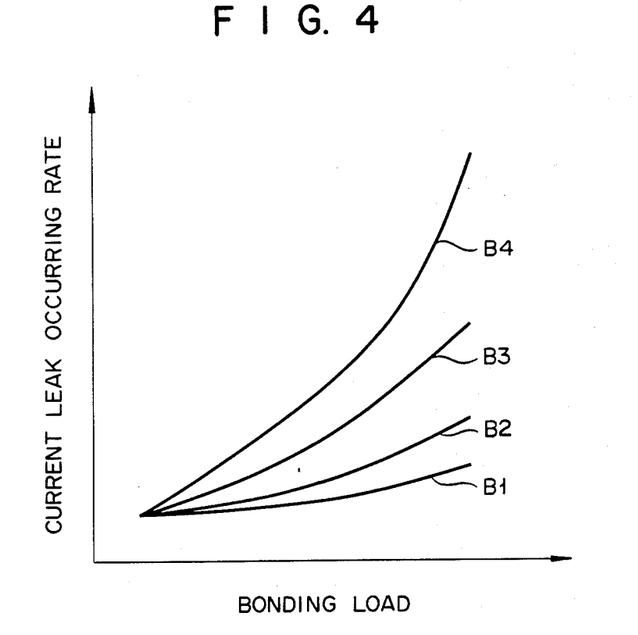
FIG. 4 is a graph showing the relation among bonding load, current leak occurring rate and bonding speed.

FIG. 4 shows the relation between bonding load and current leak occurring rate using bonding speed as a parameter. Current leak occurring rate rises as bonding load increases and it also rises as bonding speed increases.

It is therefore necessary to prevent the occurrence of current leak that the electrode wiring and semiconductor elements arranged adjacent to and near the bonding pad are sufficiently separated from the bonding pad so as not to be subject to large bonding load during the bonding process. This prevents high integration of semiconductor devices.

Bonding machines have been recently improved to carry out fully-automatic bonding. The bonding pad 20 is detected by an optical system in this fully-automatic bonding to prevent bonding displacement during the bonding process. Since the PSG layer 22 is transparent and bonding pad 20 and electrode wiring 18 are formed on a same plane, light reflection angles and strengths from bonding pad 20 and electrode wiring 18 measured by the optical system are about same, respectively. There are cases where projected portions 28a and 28b of PSG layer are formed around the bonding pad 20 as shown in FIG. 1, and irregular reflection of light occurs at projected portions 28a and 28b of PSG layer in these cases causing the outline of bonding pad 20 detected by the optical system to be blurred. Therefore, there is even in this fully-automatic bonding the tendency of bonding the center of gold ball 24 to point displaced from the practical center of bonding pad 20. It was therefore necessary that semiconductor elements or electrode wiring arranged adjacent to and near the bonding pad 20 were sufficiently spaced from the bonding pad 20.

As shown in FIG. 4, current leak occurring rate rises as bonding speed increases even with bonding load held constant. Therefore, bonding speed could not be increased enough in fully-automatic bonding to achieve desired results An object of the present invention is to prevent current leak from being caused in the semiconductor device due to mechanical impact occurring in the bonding process.

Another object of the present invention is to allow electrode wiring and semiconductor elements to be arranged nearer to the bonding pad so as to achieve high integration.

These objects can be attained by a semiconductor device of the present invention which is formed as follows. A first insulating layer is formed on a semiconductor substrate. A bonding pad is formed on the first insulating layer and a conductive layer is formed adjacent to the bonding pad on the first insulating layer. A second insulating layer is formed on the conductive layer in such a way that the surface of second insulating layer is made the same level as or lower than the surface of the bonding pad.

The semiconductor device thus formed allows mechanical impact to be suppressed during the bonding process, thus preventing current leak from being caused around the bonding pad. Therefore, the distance between the bonding pad and electrode wiring or semiconductor elements can be shortened allowing a larger number of semiconductor elements to be arranged in a chip of same size as compared to that of a conventional chip. In other words, the chip which has the same number of semiconductor elements as that of a conventional chip can be smaller-sized.

In addition, when a step is formed between the surface of the bonding pad and that of the conductive layer, detection error tending to occur at the time of optically determining position and size of bonding pad can be substantially avoided.

Further, impact is less in the bonding process, thus making it possible to use high speed bonding machine.

Furthermore, detection error of the bonding pad is less, thus allowing the bonding pad to be smaller-sized so as to attain high integration.

In addition, current leak due to mechanical impact is almost negligible, thus allowing inspection standards on semiconductor devices to be less stringent.

These and other objects and merits of the present invention will become apparent from the following detailed description with reference to the accompanying drawings in which:

Figure 5:
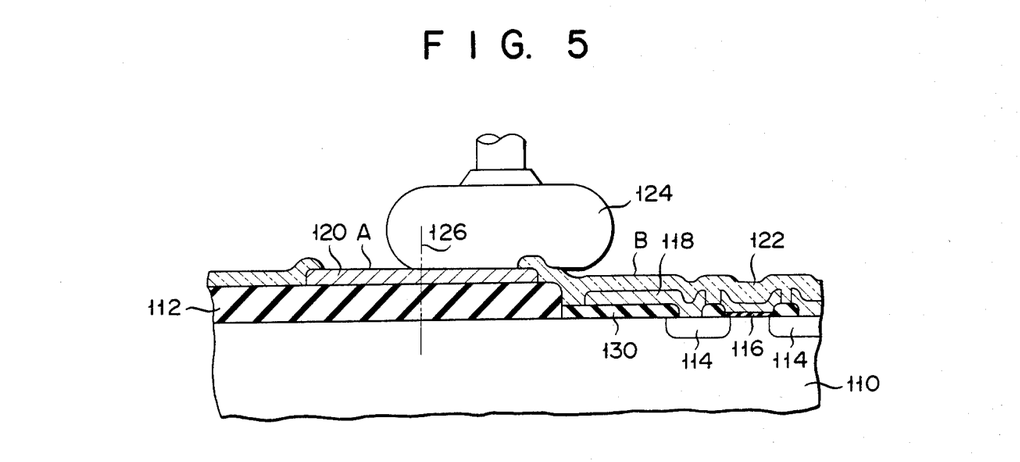
FIG. 5 is a cross sectional view showing an embodiment of semiconductor device according to the present invention.

Referring to FIG. 5, a heat oxide film 112 consisting of $SiO_2$ or an oxide film formed by CVD is formed on a semiconductor substrate 110 of N or P type with a thickness about 1.5 times larger than that of a conventional one and then removed by selective etching except the portion thereof at which a bonding pad is formed. An oxide film 130 having a thickness about half that of the oxide film 112 is formed by CVD at the removed portion. The oxide film 130 is subject to photo-etching to form diffusion holes therein through which impurity of opposite conductive type to that of semiconductor substrate 110 is introduced to form a diffusion layer 114. The oxide film 130 near the diffusion layer 114 is removed and a gate oxide film 116 is then formed at the removed portion. The gate oxide film 116 is selectively etched to form a hole through which an electrode is picked up, and aluminum is vapor-deposited all over the surface of a chip. The aluminum layer is then selectively removed to form electrode wiring 118 and a bonding pad 120. A PSG layer 122 for surface protection is formed all over the surface of the chip and the PSG layer 122 formed on the bonding pad 120 is removed to an extent smaller than the surface area of the bonding pad 130. A gold ball 124 arranged at the foremost end of a bonding wire is pressedly attached to the surface of the bonding pad 120.

In the case of a semiconductor device thus formed a step is formed between the surface A of the bonding pad 120 and the surface B of the PSG layer 122 formed on the electrode wiring adjacent to the surface A of the bonding pad 120, that is, the surface B of the PSG layer is formed lower than the surface A of the bonding pad. Therefore, when the gold ball 124 is bondingly attached to the bonding pad 120, the impact on to the PSG layer 122 is not as great. Even if positional displacement of the gold ball 124 occurs, as shown in FIG. 5, at the time of the gold ball bonding, no crack is caused in the PSG layer 122, thus reducing the likelihood of an electrical short-circuit between the gold ball 124 and the electrode wiring 118.

In addition, in the process of fully-automatic bonding at which the position of the bonding pad 120 is detected by an optical system to bondingly attach the gold ball 124 to the bonding pad 120, it is possible to detect a difference between light reflection strengths of the bonding pad 120 and that of the electrode wiring 118, so that detection error of the bonding pad 120 can be made smaller even if projected portions 128a and 128b are formed on the surface of the PSG layer, thus allowing the displacement between centers of the gold ball 124 and bonding pad 120 to be made smaller. As a result, the distance between the bonding pad 120 and electrode wiring 118 can be shortened by about half (or about $20\mu$ shorter) than that in the conventional semiconductor device, thus allowing high integration to be achieved. Further, since detection error can be suppressed lower, the bonding pad 120 can also be made smaller.

Figure 6:
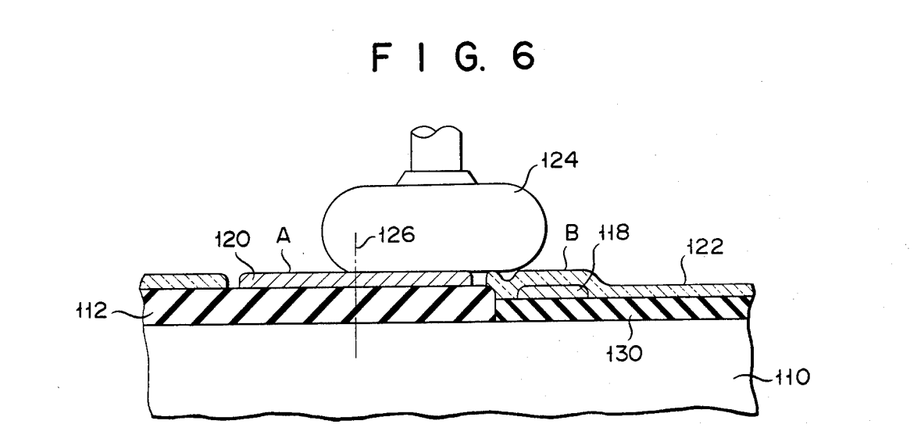
FIG. 6 is a cross sectional view showing another embodiment of a semiconductor device according to the present invention.

Another embodiment of the present invention will be now described with reference to FIG. 6. Erected or projected portions 128a and 128b of PSG layer are formed around the circumference of bonding pad 120 in the first embodiment, but PSG layer 122 and bonding pad 120 are not in contact with each other in this second embodiment. The surface A of the bonding pad 120 and the surface B of the PSG layer 122 formed on the electrode wiring 118 are formed in the same plane. Since the surface of the PSG layer 122 formed on the electrode wiring 118 does not project above the surface A of the bonding pad 120 in this second embodiment, mechanical impact can be suppressed at the time of bondingly attaching the gold ball 124 to the bonding pad 120. In addition, a step is formed between the bonding pad 120 and electrode wiring 118, so that detection error can be made smaller in the process of detecting the position of the bonding pad 120 by the optical system. Further, the PSG layer has no projected portion around the circumference of the bonding pad 120 and this also allows the error to be made smaller in positional detection of the bonding pad 120.

Figure 7:
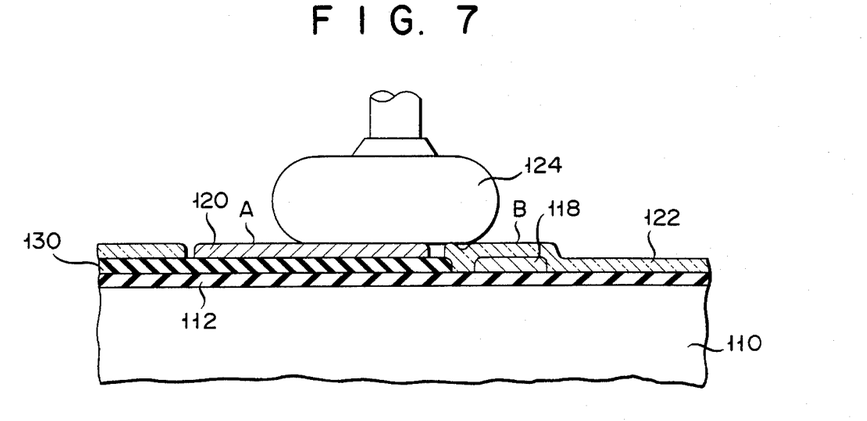
FIG. 7 is a cross sectional view showing a further embodiment of a semiconductor device according to the present invention.

A further embodiment of the present invention will be now described referring to FIG. 7. Oxide film 112 consisting of $SiO_2$ is formed on the semiconductor substrate 110, and another oxide film 130 having a thickness layer than that of the other portion is further formed by CVD on the portion where the bonding pad 120 is to be formed. The surface A of the bonding pad 120 is thus formed with a plane at the same or lower level than the surface B of the PSG layer 122 formed on the electrode wiring 118. This embodiment thus formed has also the same advantages as those of the already-described embodiments.

Though conductive layers made of aluminum are employed as the bonding pad 120 and electrode wiring 118, those made of other material may be used.

A still further embodiment of semiconductor device according to the present invention will be now described referring to FIGS. 8a–8g.

Figure 8A:
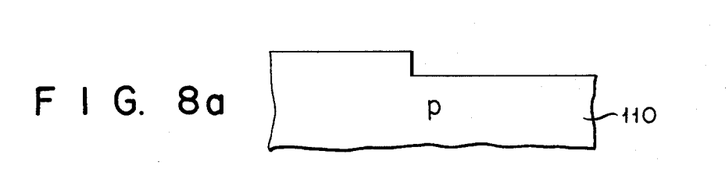
FIGS. 8a–8g, 9a–9g and 10a–10f show processes of manufacturing still further embodiments of semiconductor device according to the present invention.
Figure 8B:
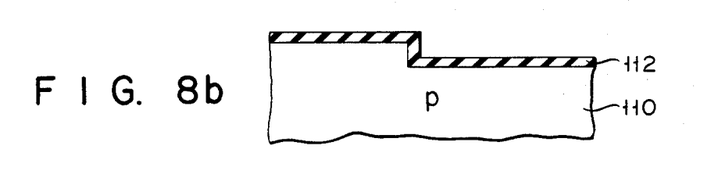
Figure 8C:
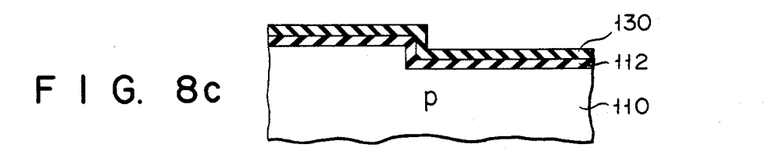
Figure 8D:
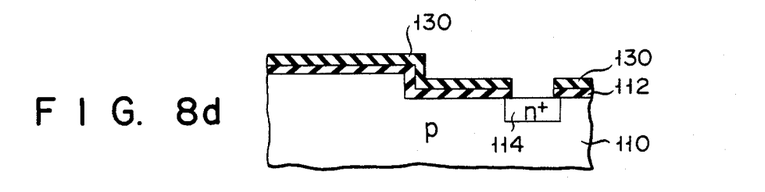
Figure 8E:
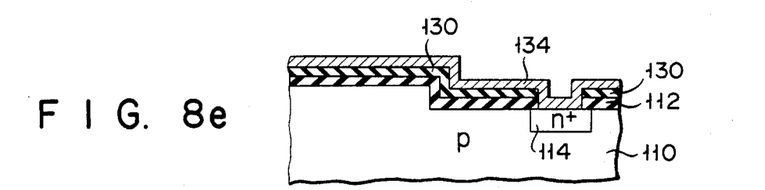
Figure 8F:
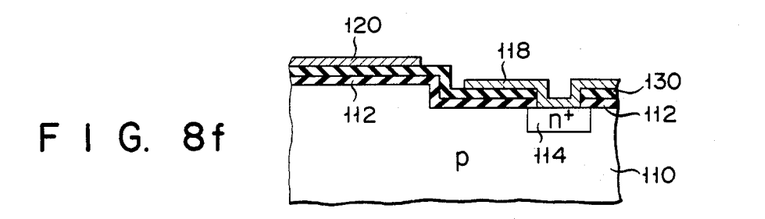
Figure 8G:
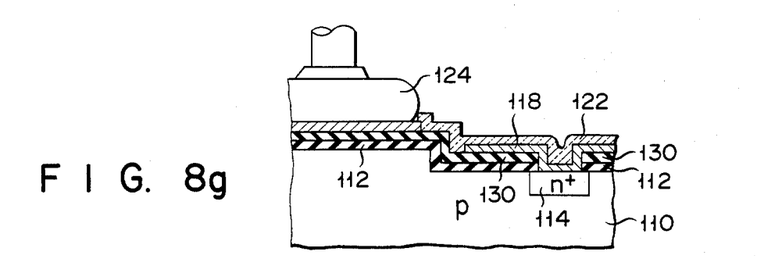

A part of semiconductor substrate 110 of P type is etched to form a step therein (FIG. 8a). Oxide film 112 is formed by heat oxidation on this semiconductor substrate 110 (FIG. 8b). Oxide film 130 is further formed by CVD on oxide film 112 (FIG. 8c). Oxide films 130 and 112 are subject to photo-etching to form a diffusion hole, through which impurity of N type is introduced to form a diffusion layer 114 (FIG. 8d). Aluminum is then vapor-deposited all over the surface of a chip to form an aluminum layer 134 (FIG. 8e). The aluminum layer 134 is selectively removed to form electrode wiring 118 and bonding pad 120 (FIG. 8f). A PSG layer 122 for surface protection is further formed by CVD all over the surface of the chip in such a way that the surface of the PSG layer formed on the electrode wiring 118 is made at the same level as or lower than the surface of the bonding pad 120, and the PSG layer formed on the bonding pad 120 is removed to an extent smaller than the surface area of the bonding pad 120. A gold ball 124 arranged at the foremost end of a bonding wire is pressedly attached to the surface of bonding pad 120 (FIG. 8g).

A still further embodiment of a semiconductor device according to the present invention will be now described referring to FIGS. 9a-9g.

Figure 9A:
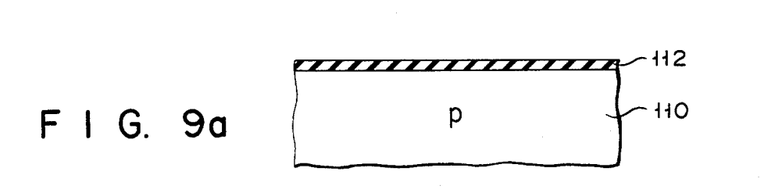
Figure 9B:
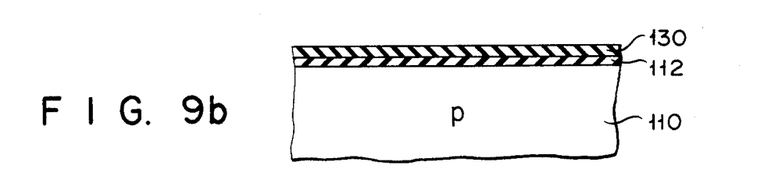
Figure 9C:
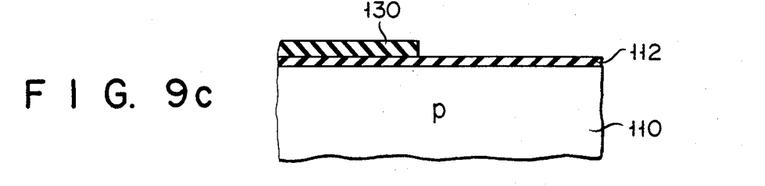
Figure 9D:
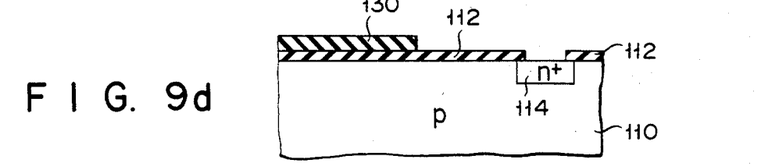
Figure 9E:
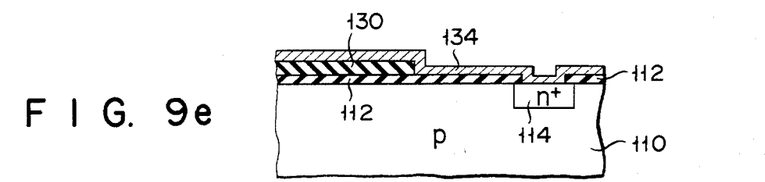
Figure 9F:
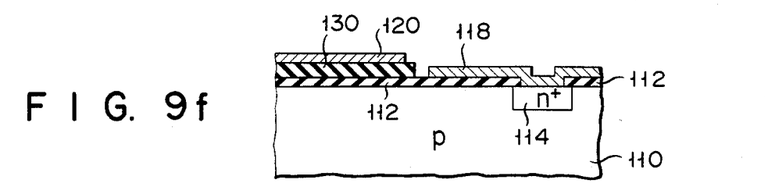
Figure 9G:
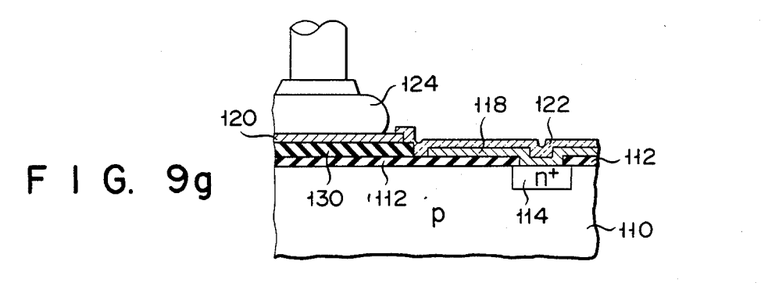

Oxide film 112 is formed by heat oxidation on a semiconductor substrate 110 of P type (FIG. 9a). Oxide film 130 is further formed by CVD on oxide film 112 (FIG. 9b). Oxide film 130 is selectively removed (FIG. 9c). Oxide film 112 is then subject to photo-etching to form a diffusion hole, through which impurity of N type is introduced to form a diffusion layer 114 (FIG. 9d). Aluminum is vapor-deposited all over the surface of a chip to form an aluminum layer 134 (FIG. 9e). The aluminum layer 134 is selectively removed to form electrode wiring 118 and a bonding pad 120 (FIG. 9f). A PSG layer 122 for surface protection is further formed all over the surface of the chip in such a way that the surface of the PSG layer formed on the electrode wiring 118 is made at the same level as or lower than the surface of the bonding pad 120, and the PSG layer 122 formed on the bonding pad 120 is removed to an extent smaller than the surface area of the bonding pad 120. A gold ball 124 arranged at the foremost end of a bonding wire is then pressedly attached to the surface of the bonding pad 120 (FIG. 9g).

A still further embodiment of a semiconductor device according to the present invention will be now described referring to FIGS. 10a-10f.

Figure 10A:
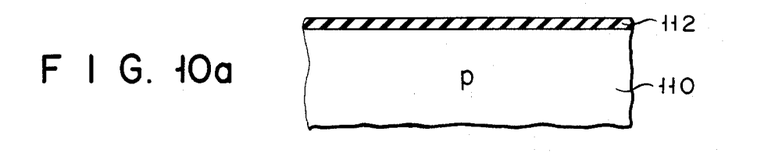
Figure 10B:
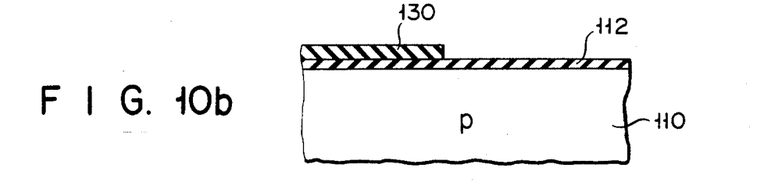
Figure 10C:
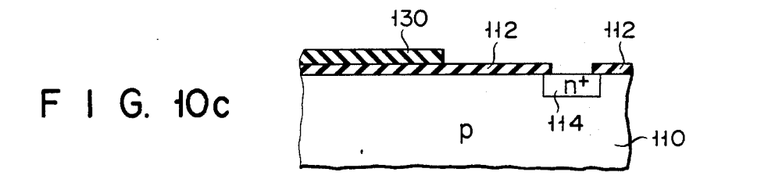
Figure 10D:
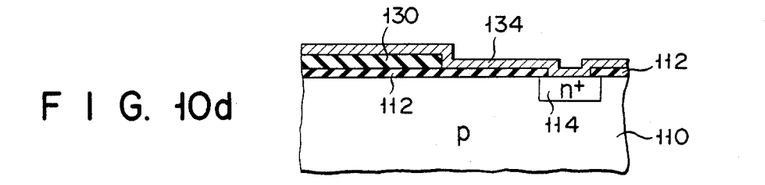
Figure 10E:
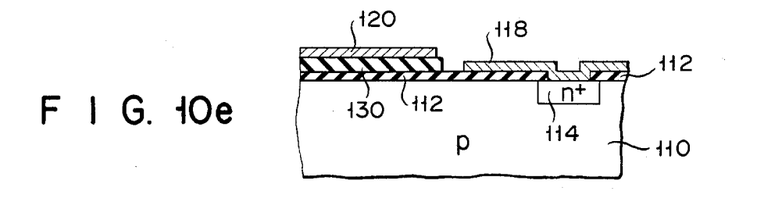
Figure 10F:
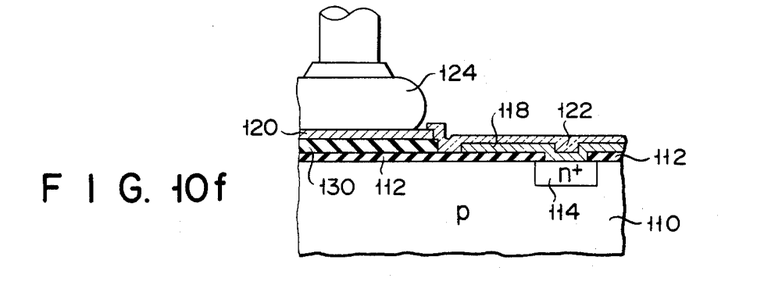

Oxide film 112 is formed by heat oxidation on the semiconductor substrate 110 of P type (FIG. 10a). Oxide film 130 is selectively formed by CVD on oxide film 112 (FIG. 10b). Oxide film 112 is then subject to photo-etching to form a diffusion hole, through which impurity of N type is introduced to form a diffusion layer 114 (FIG. 10c). Aluminum is vapor-desposited all over the surface of a chip to form an aluminum layer 134 (FIG. 10d). The aluminum layer 134 is selectively removed to form electrode wiring 118 and a bonding pad 120 (FIG. 10e). A PSG layer 122 for surface protection is further formed by CVD all over the surface of the chip in such a way that the surface of the PSG layer formed on the electrode wiring 118 is made at the same level as or lower than the surface of bonding pad 120, and the PSG layer formed on the bonding pad 120 is removed to an extent smaller than the surface area of the bonding pad 120. A gold ball 124 is then pressedly attached to the surface of bonding pad 120 (FIG. 10f).

What is claimed is:

1. A semiconductor device comprising:
a semiconductor substrate;
a first insulating layer formed on the semiconductor substrate;
a bonding pad having an upper surface formed on the first insulating layer;
a conductive layer formed on the first insulating layer adjacent and not directly connected to said bonding pad and spaced from said bonding pad a distance no greater than the widest dimension of said bonding pad; and
a second insulating layer formed to cover the conductive layer,
an upper surface portion of the second insulating layer which covers said conductive layer being next adjacent and lower than or level with the upper surface of the bonding pad.

2. A semiconductor device according to claim 1 wherein a step having two portions, one being thicker than the other, is formed in the semiconductor substrate and the bonding pad is formed on the thicker portion of said step.

3. A semiconductor device according to claim 1 or 2 wherein the first insulating layer comprises a first thicker portion on which the bonding pad is formed and a second thinner portion on which the conductive layer is formed.

4. A semiconductor device according to claim 3 wherein the first and second portions are comprised of oxide.

5. A semiconductor device according to claim 3 wherein the first insulating layer comprises a heat-oxidized film formed on the semiconductor substrate and an oxide film formed on a first portion of the heat-oxidized film, and the bonding pad is formed on the oxide film, and the conductive layer is formed on a second portion of the heat-oxidized film.

6. A semiconductor device according to claim 1 wherein said second insulating layer has projected portions in overlapping relationship with said bonding pad at an outer periphery portion of said bonding pad.

7. A semiconductor device according to claim 1 wherein said second insulating layer is adjacent to but not in contact with said bonding pad.

8. A semiconductor device according to claim 1, wherein the first insulating layer comprises a first portion on which said bonding pad is to be formed and a second portion on which said conductive layer is to be formed, said first portion being made thicker than said second portion to make the upper surface of said first portion higher than the upper surface of said conductive layer.

* * * * *